United States Patent [19]

Jinbo

[11] Patent Number: 5,313,086
[45] Date of Patent: May 17, 1994

[54] SEMICONDUCTOR DEVICE
[75] Inventor: Toshikatsu Jinbo, Tokyo, Japan
[73] Assignee: NEC Corporation, Tokyo, Japan
[21] Appl. No.: 934,275
[22] Filed: Aug. 25, 1992
[30] Foreign Application Priority Data Aug. 26, 1991 [JP] Japan .................. 3-212539

[51] Int. Cl.⁵ .................. H01L 29/68; H01L 29/78
[52] U.S. Cl. .................. 257/355; 257/360; 257/544; 257/546
[58] Field of Search ............ 257/299, 315, 318, 499, 257/504, 901, 355, 360, 369, 544, 546, 547, 548

[56] References Cited

U.S. PATENT DOCUMENTS 4,158,238  6/1979  Erb .......................... 257/299
5,043,597  8/1991  Furuyama et al. ............. 257/299

OTHER PUBLICATIONS

"An 80-ns 1-Mb Flash Memory with On-Chip Erase/Erase-Verify Controller" by K. Seki et al., IEEE, vol. 25, No. 5, Oct. 1990.

Primary Examiner—Sara W. Crane
Attorney, Agent, or Firm—Sughrue, Mion, Zinn, Macpeak & Seas

[57] ABSTRACT

A semiconductor device includes a P-type semiconductor substrate, an N-type well region formed on the surface of the substrate, a P-type well region formed in the N-type well region and a MOSFET as a flash memory element formed in the P-type well region. Upon erasure of the information in the flash memory, a high voltage is temporarily charged to the P-type and N-type well regions, in such a manner that a first high voltage pulse of a predetermined width is charged to the N-type well region, a second high voltage pulse having a pulse width narrower than the pulse width of the first pulse is charged to the P-type well region in a period between the initiation end and the termination end of the first pulse.

16 Claims, 9 Drawing Sheets

SEMICONDUCTOR DEVICE

BACKGROUND OF THE INVENTION

The present invention relates generally to a semiconductor device. More specifically, the invention relates to an improvement for a voltage control circuit device for a well region on a semiconductor substrate during erasure of information in a flash memory capable of electrically writing and erasing information.

An electrically writable and erasable flash memory has been disclosed in "An 80-ns 1-Mb Flash Memory With One-Chip Erase/Erase-Verify Controller", IEEE JOURNAL OF SOLID-STATE CIRCUITS, Vol. 25, No. 5, October, 1990, pp 1147~1151, for example. When the flash memory is fabricated into an integrated circuit together with peripheral circuits, it is typically formed into the following construction.

An N-type well region is formed on the surface of a P-type silicon substrate. A P-type well region is formed within the N-type well region. N-type doped regions serving as a drain and a source of a memory element is formed within the P-type well region. On the P-type well region between the drain and source, a floating gate and a control gate are formed.

When the information in the memory element is to be erased, a high voltage is charged to the N-type well region and the P-type well region. At this time, if there is a difference in resistivities, junction capacitances or so forth between the N-type well region and the P-type well region, it is possible to establish a forward bias at PN junction between the well regions, in the transition of the voltage variation from the grounding voltage to the high voltage of the P-type and N-type well regions. Then, holes are injected from the P-type well region to the P-type silicon substrate via the N-type well region. This is a defect because it leads to an unnecessary increase in power consumption. Also, it is possible to cause latching up of a circuit formed by other complementary type MOS transistor by the hole.

Therefore, it is an object of the present invention to provide a semiconductor device which can prevent a temporary forward bias from occurring between the well regions, upon charging a high voltage to the P-type well region and the N-type well region.

Another object of the present invention is to provide a semiconductor device which can certainly maintain a reverse bias between the well regions upon erasure of information in the flash memory and thus will never affect, such as latching up or so forth, for other circuit.

SUMMARY OF THE INVENTION

In order to accomplish the above-mentioned objects, a semiconductor device comprises:
a one conductivity type semiconductor substrate;
an opposite conductivity type well region formed on the surface of the semiconductor substrate;
an one conductivity type well region formed on the opposite conductivity type well region;
an insulated gate type field effect transistor formed in the one conductivity type well region; and
well voltage control means for charging a first pulse having a voltage level sufficient for establishing a reverse bias at the PN junction between the opposite conductivity type well region and the one conductivity type well region, to a first portion of the opposite conductivity type well region for a given period, and charging a second pulse having the above-defined voltage level to a second portion of the one conductivity type well region in a period between the initiation timing and termination timing of the first pulse, which second pulse has an initiation timing later than the initiation timing of the first pulse and a termination timing earlier than the termination timing of the first pulse.

In the preferred construction, the well voltage control means comprises first voltage supply means for generating the first pulse in response to a control signal, second voltage supply means for generating the second pulse in response to the control signal, connection means for connecting supply output terminals of the first and second voltage supply means, the connection means having a predetermined impedance, and the first and second voltage supply means operating in complementary fashion. Also, the connection means may comprise a first equivalent impedance between a third portion spaced from the first portion and positioned within the opposite conductivity well region and the first portion, a second equivalent impedance between a fourth portion spaced from the second portion and positioned within the one conductivity well region, and wiring means connecting the first and second equivalent impedances in series. Alternatively, the connection means may comprise a resistor element connected between the supply output terminals of the first and second voltage supply means. In the further alternative, the connection means may comprise a depletion MOS type field effect transistor connected between the supply output terminals of the first and second voltage supply means.

Also, it is preferred that the well voltage control means comprises delay means for delaying an external control signal, first logic means for generating the first pulse during active state of at least one of the delayed output of the delay means and the external control signal, and second logic means for generating the second pulse during active state of both of the delayed output and the external control signal.

In the practical application, the insulation gate type field effect transistor is a storage element having a floating gate and a control gate and being electrically writable and erasable, and the voltage levels of the first and second pulses are sufficient for erasing information in the storage element.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

In advance of discussion for the preferred embodiments of the present invention, brief discussion of the prior art will be given below with reference to the drawings in order to facilitate better understanding of the present invention.

Figure 9:
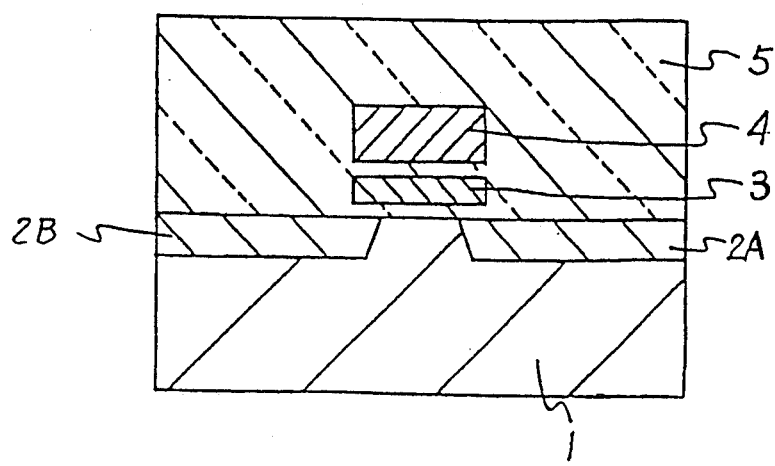
FIG. 9 is a section of a flash memory element which is electrically writable and erasable.

As shown in FIG. 9, a flash memory has N-type impurity diffusion regions 2A and 2B serving as a drain and a source, on a P-type silicon substrate 1. Also, a floating gate 3, which is electrically insulated from the outside by an insulation layer 5, and a control gate 4 for switching a memory element are formed on the P-type silicon substrate 1. Between the floating gate 3 and the substrate 1, a silicon oxide layer of approximately 10 nm thickness which is typically called a tunnel oxide layer, is formed.

Figure 10:
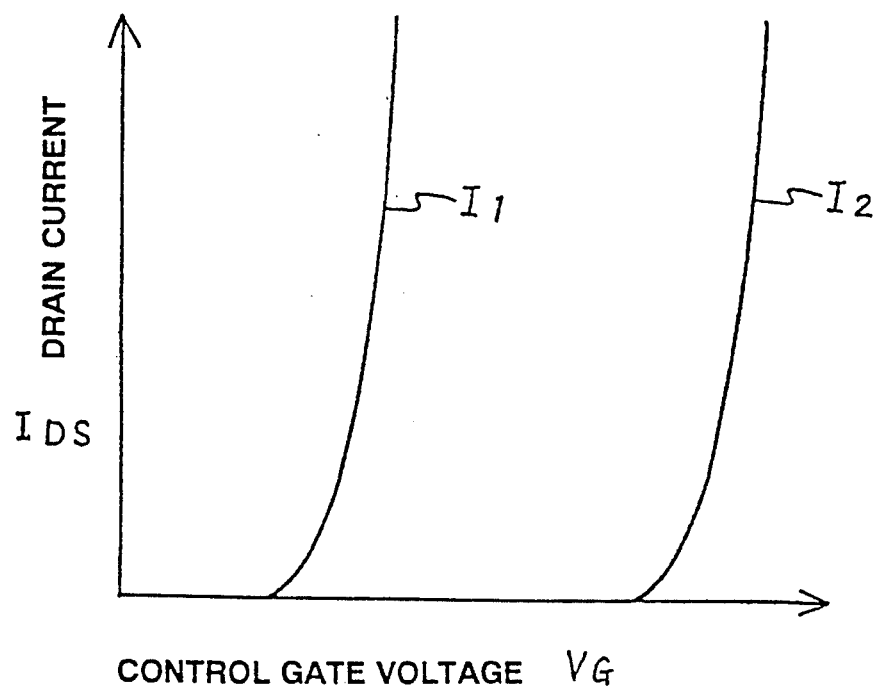
FIG. 10 is a drain current characteristic chart of the flash memory element.

Upon writing information in this memory element, a high voltage is applied to the control gate and the drain of the memory element. At the same time, the grounding voltage is applied to the source so as to inject electrons to the floating gate by hot carrier injection. On the other hand, upon erasure of the information in the memory element, the grounding voltage is applied to the control gate of the memory element. At the same time, the drain is situated in the floating condition and high voltage is applied to the source for discharging the electron in the floating gate by F-N (Fowler-Nordheim) tunneling. As illustrated in the current characteristic chart of FIG. 10, the characteristics of this memory element is the current flows at low control gate voltage upon erasure as shown by the curve $I_1$, and the current will not flow unless high control gate voltage as shown by the curve $I_2$ is charged. Therefore, by using such variation of a threshold voltage, writing of the information is performed.

However, in the erasure system of this memory element, the voltage to be applied to the source is limited so as not to be higher than or equal to a junction withstanding voltage of the N-type impurity diffusion region which forms the source. Therefore, it is possible that the desired erasure characteristics cannot be obtained in some cases. For this reason, there is also proposed another erasure system, in which the high voltage is applied to the substrate formed thereon the memory element. In practice, if the high voltage is applied to the overall region of the substrate of the semiconductor device, other circuits on the common substrate becomes inoperative. Therefore, erasure is typically performed with the construction as illustrated in FIGS. 11A and 11B.

On a P-type silicon substrate 101, an N-type well region 102 is formed. In the N-type well region 102, a P-type well region 103 is formed. N-type impurity diffusion regions 104B and 104C respectively serving as a drain and a source of the memory element are formed in the P-type well region 103. Also, a floating gate 108 and a control gate 109 are formed between the N-type impurity diffusion regions 104B and 104C. Also, in the P-type well region 103, a P-type impurity diffusion region 105A is formed, and in the N-type well region 102, an N-type impurity diffusion region 104A is formed. Respective of the N-type and P-type impurity diffusion regions 104A, 104B, 104C and 105A are separated by field oxide layer 106. In addition, metal conductor layers 110A, 110B, 110D are formed on an interlayer insulation layer 107. The metal conductor 110A is electrically connected to the N-type impurity diffusion region 104A and the P-type impurity diffusion region 105A via contact holes 120A and 120B. The metal conductor 110C is electrically connected to the N-type impurity diffusion region 104B which serves as the drain of the memory element via a contact hole 120C. Similarly, the metal conductor 110D is electrically connected to the N-type impurity diffusion region 104C serving as the source of the memory element, via a contact hole 120D.

Upon erasure, the high voltage is charged to the metal conductor 110A from a control circuit which is not shown. Then, the N-type well region 102 and the P-type well region 103 becomes elevated high voltage to perform erasure.

Figure 11A:
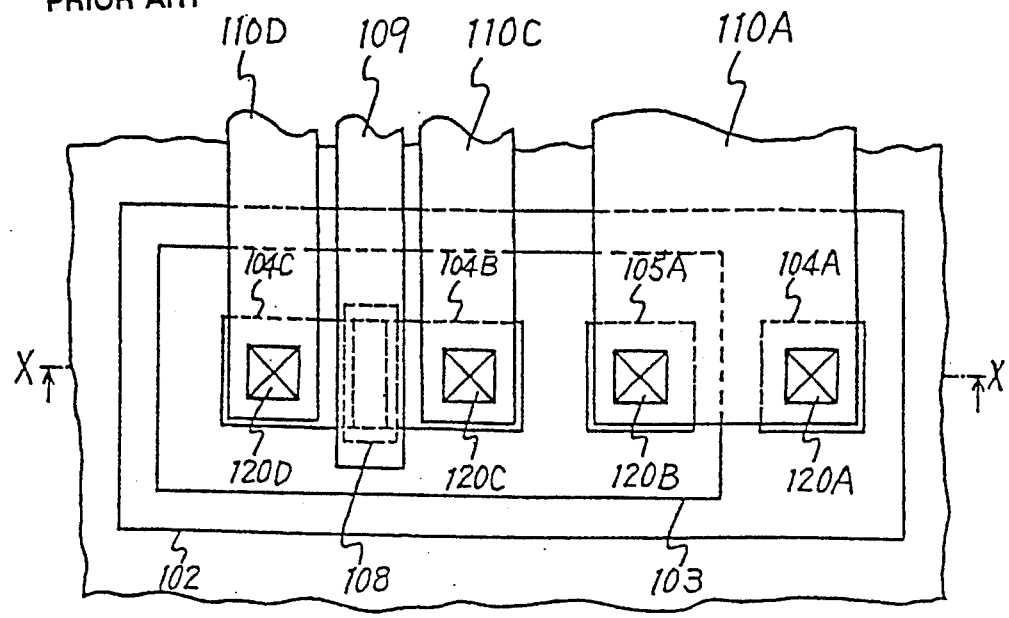
FIG. 11A is a plan view of a semiconductor device which has the conventional flash memory element.
Figure 11B:
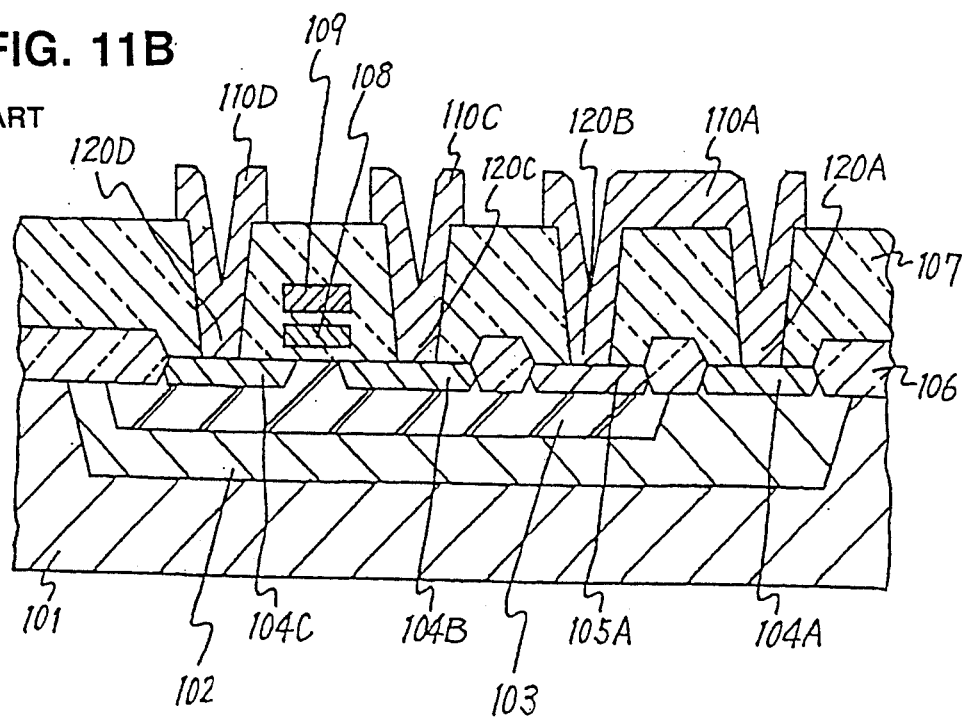
FIG. 11B is a section taken along line X—X of FIG. 11A.

In the prior art of FIGS. 11A and 11B, the high voltage is charged to the N-type well region 102 via the N-type impurity diffusion region 104A and the high voltage is also applied to the P-type well region 103 via the P-type impurity diffusion region 105A. If there is a difference in the resistivities or the junction capacity between the N-type well region 102 and the P-type well region 103, the voltage relationship at the junction between the N-type well region 102 and the P-type well region 103 may becomes the high voltage at the side of the P-type well region 103 and the low voltage at the N-well region 102 during the transition in which the voltage of the N-type well region 102 and the P-type well region 103 vary from the grounding voltage to the high voltage, so as to cause a forward bias. As a result, holes are injected to the P-type silicon substrate 101 from the P-type well region 103 via the N-type well region 102. This results in unnecessary increase of the power consumption. In addition, by injection of the hole to the P-type silicon substrate, it is possible to cause latching up of other circuits formed with a complementary type MOSFET.

Furthermore, although only one memory element is shown in FIGS. 11A and 11B, it is typical to arrange a plurality of memory elements in matrix form. Therefore, the N-type well region 102 and P-type well region 103 become substantially large. In order to adjust the speed of transition from the low voltage to the high voltage at the N-type well region 102 and the P-type well region 103 to be substantially equal to each other for avoiding forward bias at the junction, a large number of N-type impurity diffusion regions 104A and the P-type impurity diffusion regions 105A become necessary which increases the size of the semiconductor device.

Next, discussion for the first embodiment of a semiconductor device will be discussed with reference to FIGS. 1A, 1B and 2. In the following discussion, the elements common to or substantially similar to those in the prior art discussed above will be represented by the reference numerals. In the shown embodiment, on the P-type silicon substrate 101, the N-type well region 102 is formed. In the N-type well region 102, the P-type well region 103 is formed. N-type impurity diffusion regions 104B and 104C respectively serving as the drain and the source of the memory element are formed in the P-type well region 103. Also, the floating gate 108 and the control gate 109 are formed between the N-type impurity diffusion regions 104B and 104C. Also, in the P-type well region 103, first and second P-type impurity diffusion regions 105A and 105B are formed at mutually different positions to each other, and in the N-type well region 102, first and second N-type impurity diffusion regions 104A and 104D are formed at mutually different positions to each other. Respective of the N-type and P-type impurity diffusion regions 104A, 104B, 104C, 104D, 105A and 105B are separated by field oxide layer 106. In addition, metal conductor layers 110A, 110B, 110C, 110D and 110E are formed on the interlayer insulation layer 107. The metal conductor 110A is electrically connected to the first N-type impurity diffusion region 104A via the contact hole 120A. The metal conductor 110B is electrically connected to the first P-type impurity diffusion region 105A via the contact hole 120B. The metal conductor 110C is electrically connected to the N-type impurity diffusion region 104B which serves as the drain of the memory element via a contact hole 120C. The metal conductor 110D is electrically connected to the N-type impurity diffusion region 104C serving as the source of the memory element, via the contact hole 120D. The metal conductor 110E is electrically connected to the second P-type impurity diffusion region 105B and the second N-type impurity diffusion region 104D via contact holes 120E and 120F.

Figure 1A:
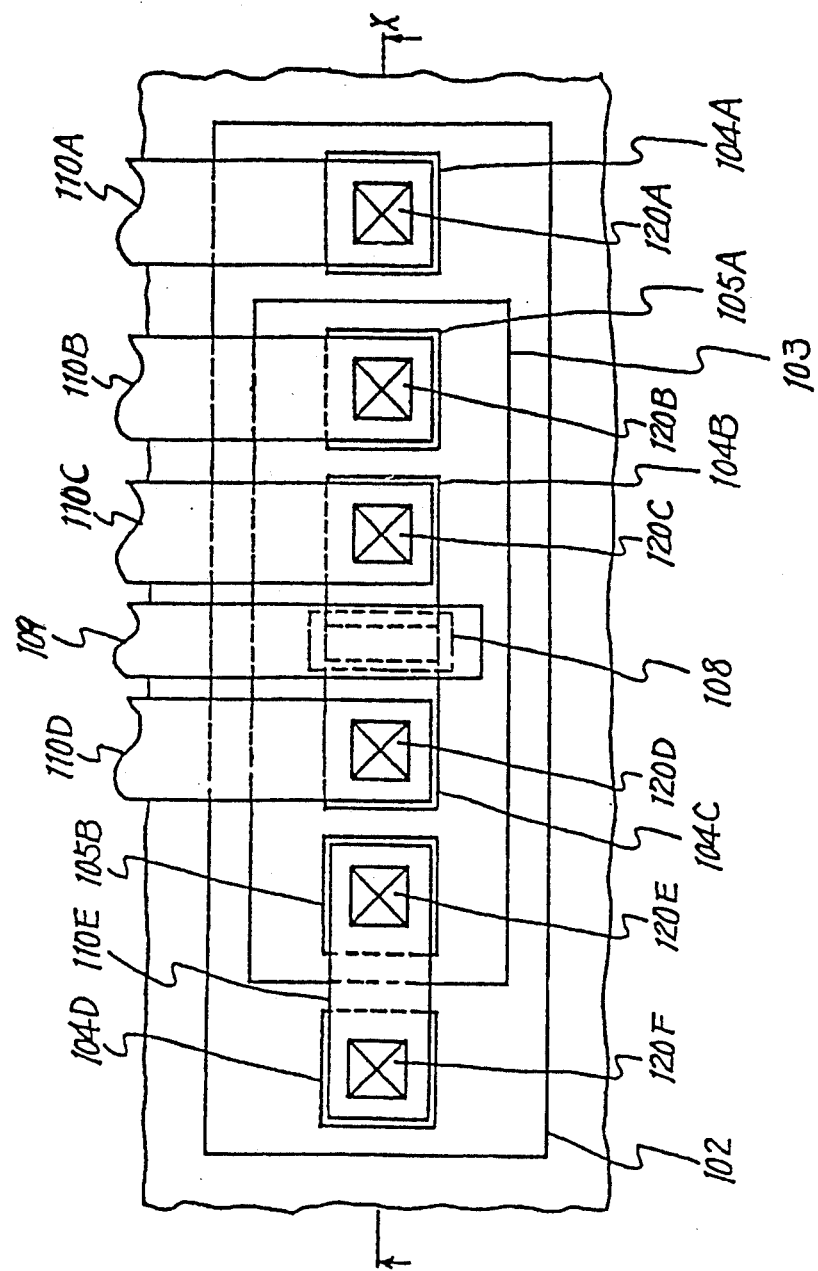
FIG. 1A is a plan view of the first embodiment of a semiconductor device according to the present invention.
Figure 1B:
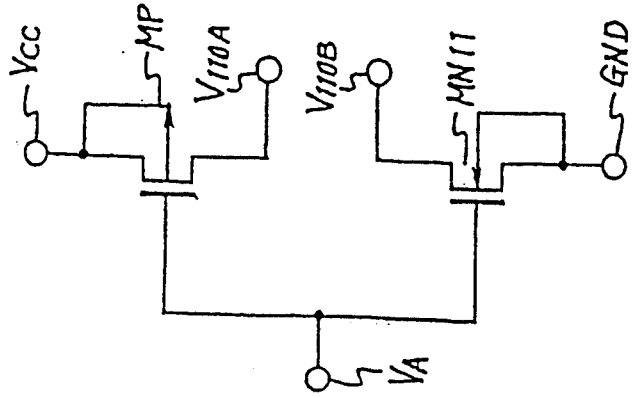
FIG. 1B is a circuit diagram of the first embodiment of a well voltage control circuit according to the present invention.
Figure 2:
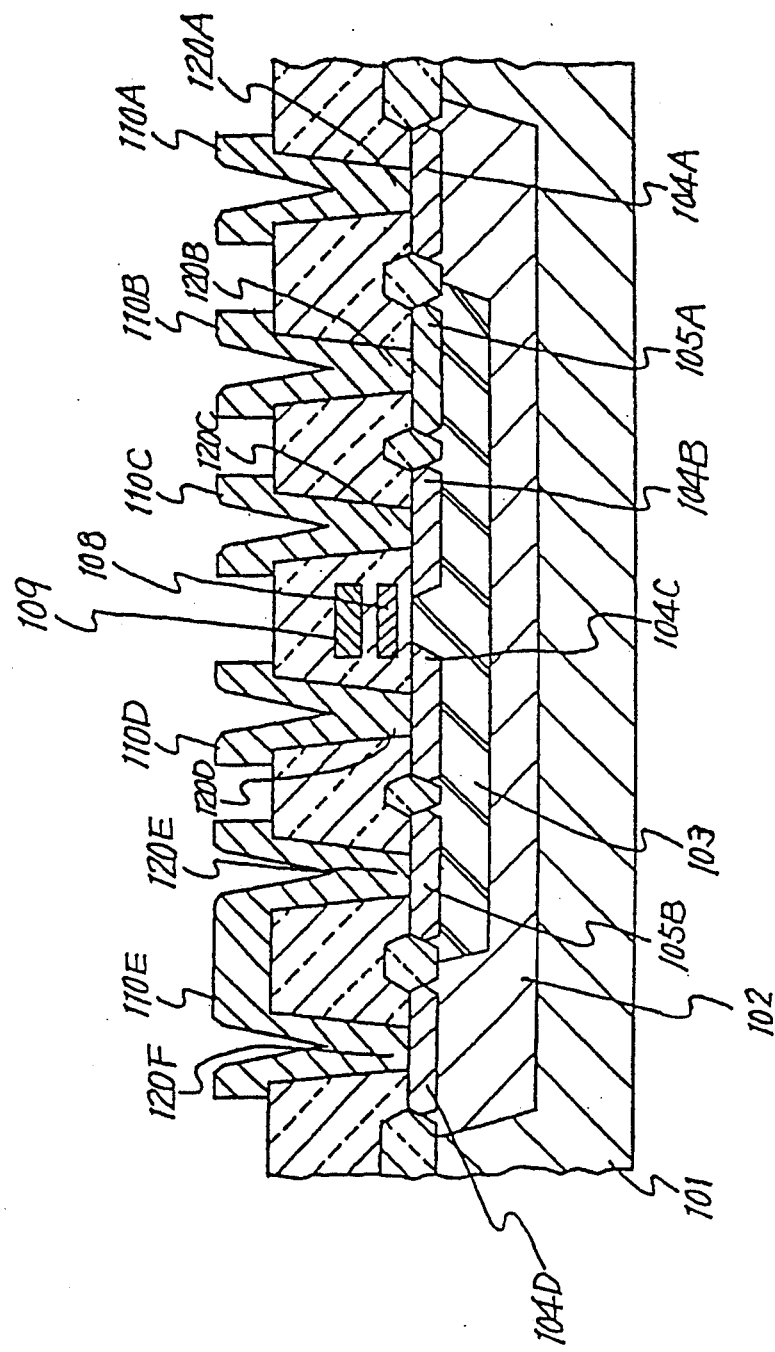
FIG. 2 is a section taken along line X—X of FIG. 1A.

A well voltage control circuit has a first supply circuit which includes a P-type MOSFET MP11 having a source connected to a power source voltage terminal Vcc and the drain serving as the first output terminal $V_{110A}$ of the control circuit, and is connected to the metal conductor 110A of FIG. 1A, and a second supply circuit which includes an N-type MOSFET MN11 having the source connected to a grounding voltage terminal GND and the drain serving as the second output terminal $V_{110B}$ of the well voltage control circuit, and is connected to the metal conductor 110B of FIG. 1A. The gates of the P-type MOSFET MP11 and the N-type MOSFET MP11 are connected to a control signal terminal $V_A$.

Figure 3:
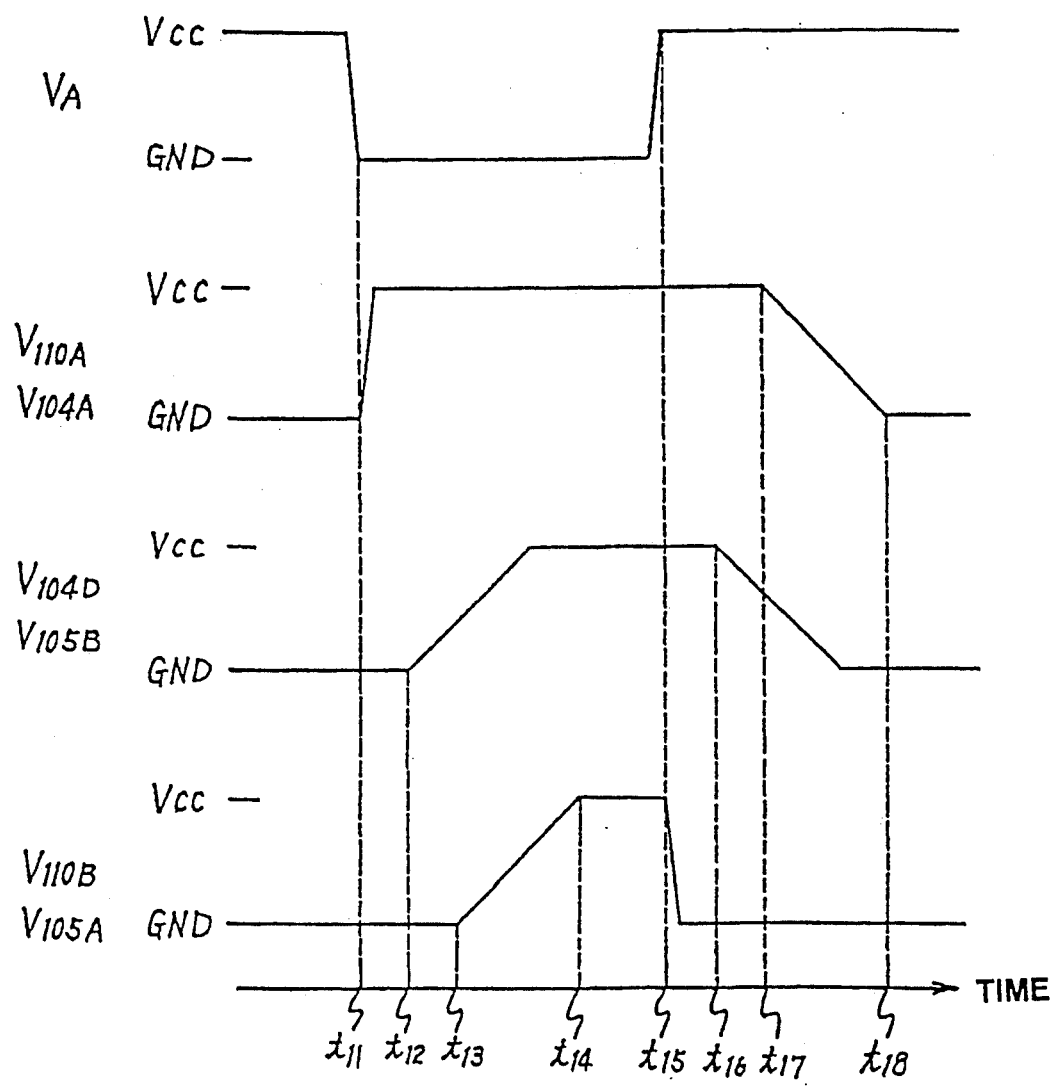
FIG. 3 is a chart of voltage waveforms at various portions showing the operation of the first embodiment of the invention.

Next, operation of the shown embodiment will be discussed with reference to the voltage waveform chart of FIG. 3. In the initial state, a control signal $V_A$ is held at high level. At this position, the P-type MOSFET MP11 is held in the non-conductive state and the N-type MOSFET MN11 is held in the conductive state. Both the N-type well region 102 and the P-type well region 103 are applied the grounding voltage GND through the N-type MOSFET MN11. When the control signal $V_A$ is varied from high level to low level at a time $t_{11}$, the N-type MOSFET MN11 becomes non-conductive and the P-type MOSFET MN11 becomes conductive. Then, the voltage (first pulse) of the first output terminal $V_{110A}$ and the first N-type impurity diffusion region 104A connected to the first output terminal $V_{110A}$ through the metal conductor 110A becomes high level. This causes variation of the voltage of the N-type well region 102 to high level via the first N-type impurity diffusion region 104A. During transition of the voltage of the N-type well region 102 toward high level, the voltage of the second N-type impurity diffusion region 104D which is positioned at different position to the first N-type impurity diffusion region 104A varies toward high voltage at a time $t_{12}$ with a slight delay from the time $t_{11}$.

Since the second N-type impurity diffusion region 104D and the second P-type impurity diffusion region 105B provided in the P-type well region 103 are electrically connected via the metal conductor 110E, the voltage $V_{105B}$ also rises toward the high voltage from the time $t_{12}$. Accordingly, the voltage of the P-type well region 103 varies toward the high voltage via the second P-type impurity diffusion region 105B. Then, the voltage $V_{105A}$ of the first P-type impurity diffusion region 105A positioned at different position to the second P-type impurity diffusion region 105B in the P-type well region 103 is risen to the high voltage from a time $t_{13}$ with slight delay from the time $t_{12}$, and becomes equal voltage to the power source voltage Vcc at a time $t_{14}$.

Here, since the second N-type impurity diffusion region 104D is positioned at a position most distanced from the first N-type impurity diffusion region 104A in the N-type well region 102 and to have the longest delay in rising the voltage upon variation of the voltage of the N-type well region 102 from the low voltage to the high voltage, the forward bias at the junction between the N-type well region 102 and the P-type well region 103 will be never caused when the voltage of the N-type well region 102 and the P-type well region 103 is varied from the low voltage to the high voltage.

Next, when the control signal $V_A$ is varied from the low level to the high level at a time $t_{15}$, the P-type MOSFET MP11 becomes non-conductive and the N-type MOSFET MN11 becomes conductive. Then, the voltage (the second pulse) of the second output terminal $V_{110B}$ and the first P-type impurity diffusion region 105A connected to the second output terminal via the metal conductor 110B becomes low voltage. Also, the voltage of the P-type well region 103 is varied toward the low voltage via the first P-type impurity diffusion region 105A. While the voltage of the P-type well region 103 is lowered toward the low voltage, the voltage $V_{105B}$ of the second P-type impurity diffusion region 105B arranged at the different position to the first P-type impurity diffusion region 105A, to which the low voltage is supplied, is varied toward the low voltage from a time $t_{16}$ slightly delayed from the time $t_{15}$.

Since the second P-type impurity diffusion region 105B and the second N-type impurity diffusion region 104D provided in the N-type well region are electrically connected through the metal conductor 110E, the voltage $V_{104D}$ of the second N-impurity diffusion region 104D is varied toward the low voltage from the time $t_{16}$. Then, the voltage of the N-type well region 102 is varied to the low voltage via the second N-type impurity diffusion region 104D. The voltage $V_{104A}$ of the first N-type impurity diffusion region 104A positioned at different position to the second N-type impurity diffusion region 104D in the N-type well region 102 varies to the low voltage from a time $t_{17}$ with slight delay from the time $t_{16}$, and becomes equal voltage to the grounding voltage GND at a time $t_{18}$.

Here, since the second P-type impurity diffusion region 105B is positioned at the most distanced position from the first P-type impurity diffusion region 105A in the P-type well region 103, and to have the largest delay in lowering the voltage when the voltage of the P-type well region 103 is varied from the high voltage to the low voltage, the forward bias at the junction between the N-type well region 102 and the P-type well region 103 can be avoided when the voltage of the N-type well region 102 and the P-type well region 103 is varied from the high voltage to the low voltage.

As can be clear from the discussion given above, in the shown construction, the parasitic resistance of the N-type well region 102 and the parasitic resistance of the P-type well region 103 are disposed in series between the output terminal $V_{110A}$ of the first voltage supply circuit and the output terminal $V_{110B}$ of the second voltage supply circuit, which parasitic resistances serve as connection means between the output terminals $V_{110A}$ and $V_{110B}$.

Figure 4A:
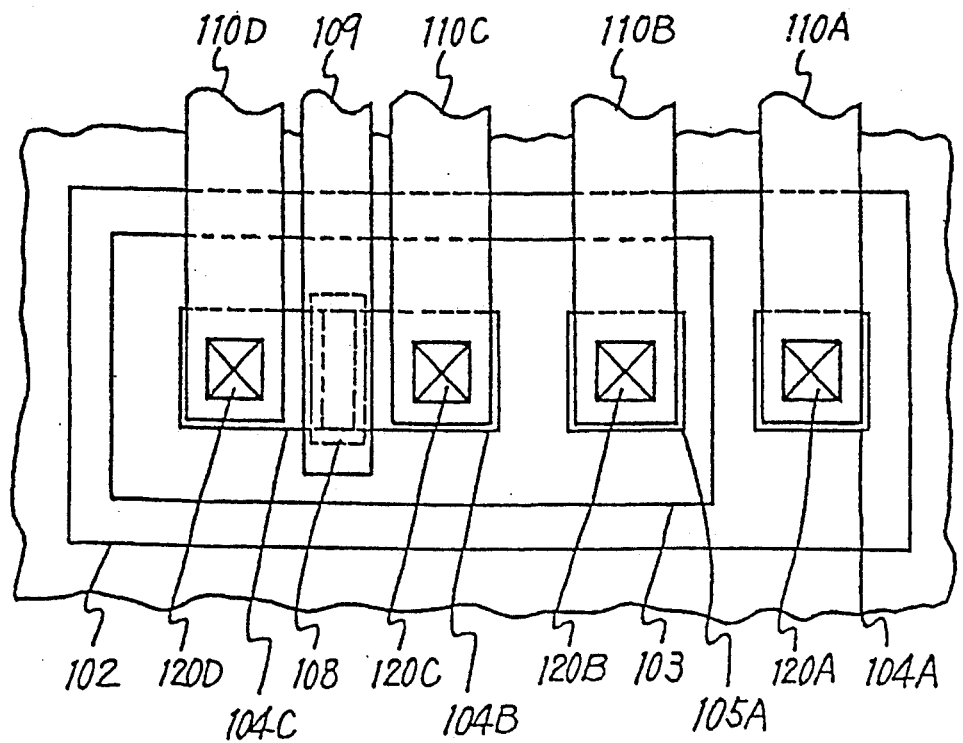
FIG. 4A is a plan view of the second embodiment of a semiconductor device according to the present invention.
Figure 4B:
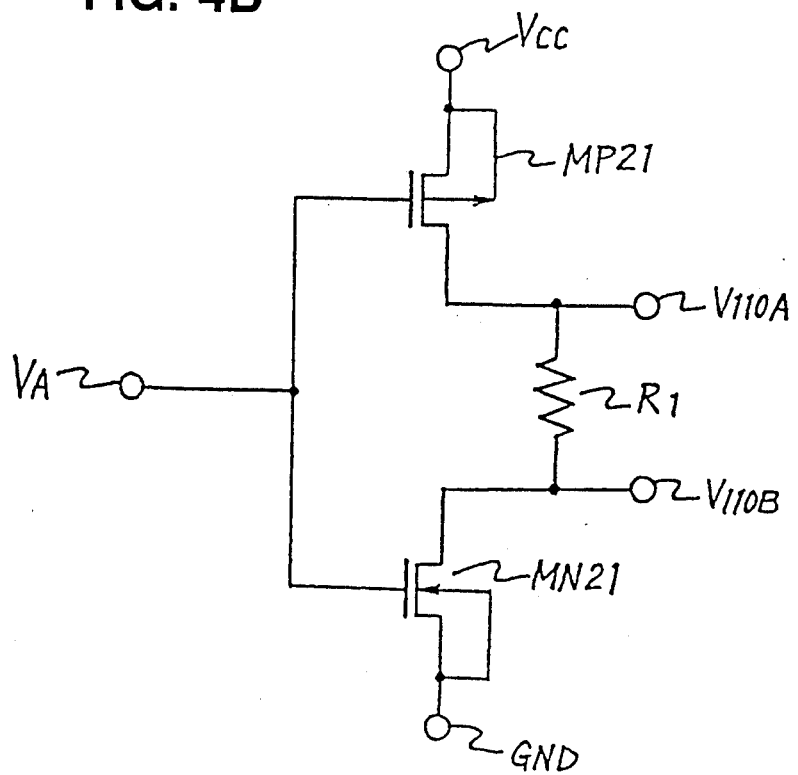
FIG. 4B is a circuit diagram of the second embodiment of a well voltage control circuit according to the present invention.

FIG. 4A is a plan view of a semiconductor chip forming the second embodiment of the semiconductor device according to the present invention, and FIG. 4B is a circuit diagram of the well voltage control circuit in the second embodiment of the semiconductor device.

The construction illustrated in FIG. 4A is similar to that of FIG. 1 set forth above except for absence of the N-type impurity diffusion region 104D, the P-type impurity diffusion region 105B, the contact holes 120E and 120F and the metal conductor 110E.

The control circuit of FIG. 4A has a first supply circuit which includes a P-type MOSFET MP21 having a source connected to a power source voltage terminal Vcc and the drain serving as the first output terminal $V_{110A}$ of the control circuit, and is connected to the metal conductor 110A of FIG. 4A, and a second supply circuit which includes an N-type MOSFET MN21 having the source connected to a grounding voltage terminal GND and the drain serving as the second output terminal $V_{110B}$ of the well voltage control circuit, and is connected to the metal conductor 110B of FIG. 4A. The gates of the P-type MOSFET MP21 and the N-type MOSFET MN21 are connected to a control signal terminal $V_A$. Furthermore, a resistor element R1 (connection means) is provided between the first output terminal $V_{110A}$ and the second output terminal $V_{110B}$.

Figure 5:
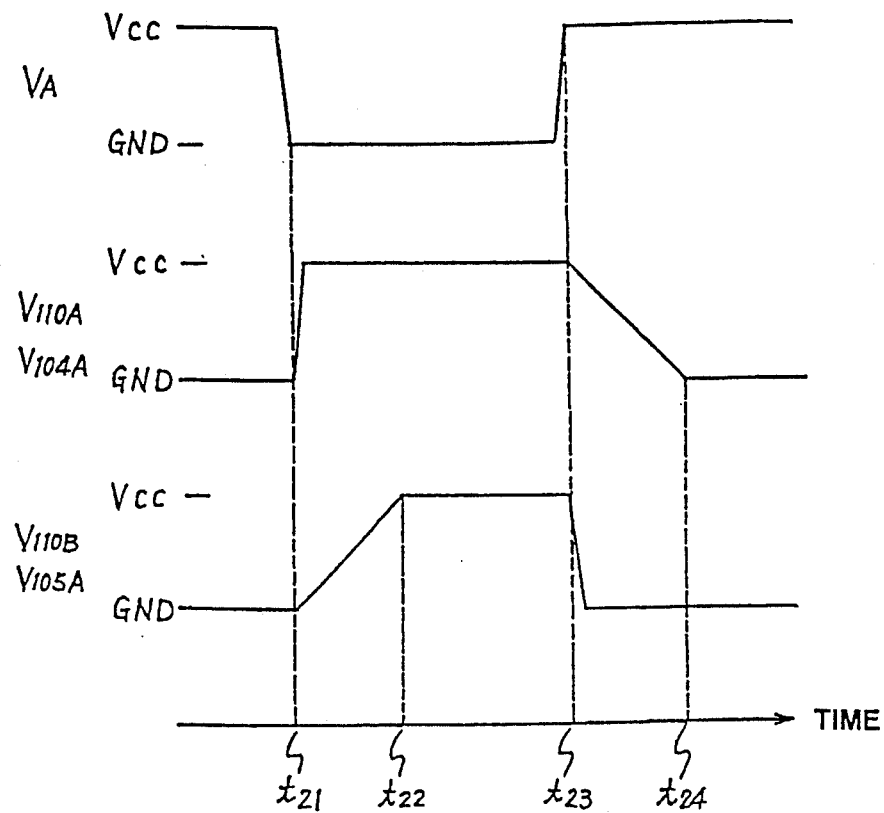
FIG. 5 is a chart of voltage waveforms of various portions showing the operation of the second embodiment of the present invention.

Next, the operation of the shown embodiment will be discussed with reference to the chart of the voltage waveform in FIG. 5. In the initial state, a control signal $V_A$ is held at high level. At this position, the P-type MOSFET MP21 is held in the non-conductive state and the N-type MOSFET MN21 is held in the conductive state. Both of the N-type well region 102 and the P-type well region 103 are applied the grounding voltage GND via the N-type MOSFET MN21.

When the control signal $V_A$ is varied from high level to low level at a time $t_{21}$, the N-type MOSFET MN21 becomes non-conductive and the P-type MOSFET MP21 becomes conductive. Then, the voltage of the first output terminal $V_{110A}$ and the first N-type impurity diffusion region 104A connected to the first output terminal $V_{110A}$ through the metal conductor 110A becomes high voltage. This causes variation of the voltage of the N-type well region 102 to the high voltage via the first N-type impurity diffusion region 104A.

On the other hand, the P-type well region 103 also varies the voltage toward the high voltage via the first P-type impurity diffusion region 105A, because the second output terminal $V_{110B}$ connected to the first impurity diffusion region 105A varies the voltage toward the high voltage via the P-type MOSFET MP21 and the resistor element R1. Therefore, the speed of the transition of the voltage of the second output terminal is lowered to reach the power source voltage $V_{cc}$ at a time $t_{22}$. Next, when the control signal $V_A$ is varied from the low level to the high level at a time $t_{23}$, the P-type MOSFET MP21 becomes non-conductive and the N-type MOSFET MN21 becomes conductive. Then, the voltage of the second output terminal $V_{110B}$ and the first P-type impurity diffusion region 105A connected to the second output terminal via the metal conductor 110B becomes low voltage. Also, the voltage of the P-type well region 103 is varied toward the low voltage via the first P-type impurity diffusion region 105A.

On the other hand, while the voltage of the N-type well region 102 is varied via the first N-type impurity diffusion region 104A, since the first output terminal 110A connected to the first N-type impurity diffusion region 104A varies the voltage via the N-type MOSFET MN21 and the resistor element R1, the speed of variation of the voltage becomes low and reaches the grounding voltage GND at a time $t_{24}$. Here, by appropriately designing the resistance value of the resistor element R1 to vary the speed of variation of the voltage of the first output terminal 110A and the second output terminal 110B, the forward bias at the junction between the N-type well region 102 and the P-type well region 103 upon variation of the voltages of the N-type well region 102 and the P-type well region 103 can be avoided.

While the foregoing first embodiment utilizes the parasitic resistance of the wells provided with the memory array as the connection means for connecting the output terminals of the first and second voltage supply circuit, the second embodiment employs the resistor element R1 provided at a different position than the memory array. The second embodiment is advantageous in the capability of freely setting the resistance value of the resistor elements. It should be appreciated that the resistor element can be a diffusion resistor element or a resistor element utilizing a polycrystalline silicon.

Figure 6:
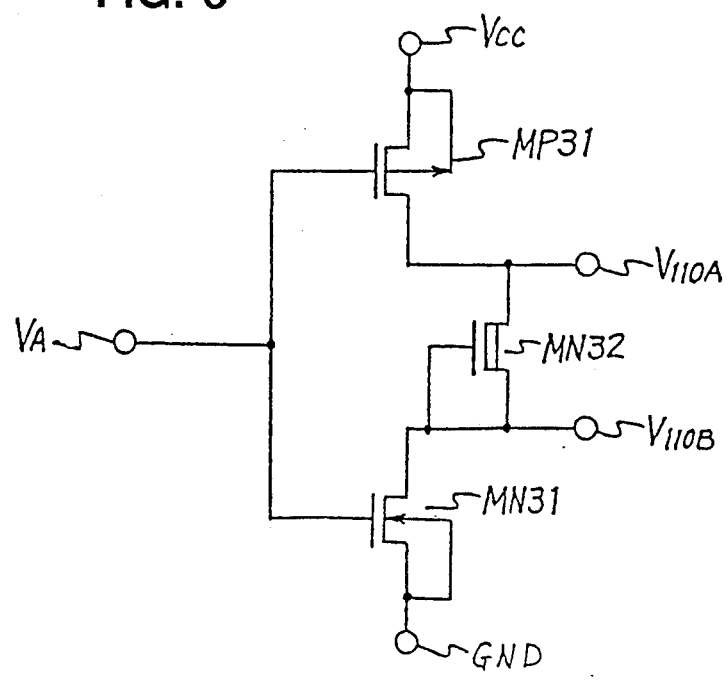
FIG. 6 is a circuit diagram showing the third embodiment of a well voltage control circuit according to the invention.

FIG. 6 is a circuit diagram showing the well voltage control circuit in the third embodiment of the present invention. In the shown well voltage control circuit, the resistor element R1 in the well voltage control circuit of FIG. 4B is replaced with a depletion N-type MOSFET MN32. The drain of the depletion N-type MOSFET MN32 is connected to the first output terminal $V_{110A}$ and the source and gate thereof are connected to the second output terminal 110B for operation as a constant current source. The operation of the shown control circuit is substantially the same as that discussed with respect to FIG. 4B. As can be appreciated herefrom, when a proper element as the resistor element is not available, it can be replaced with the depletion N-type MOSFET. On the other hand, a large resistance value is desired when the resistor element is formed by the N-type impurity diffusion region, for example, it requires a wide area on the semiconductor device. However, when the equivalent effect is realized by the depletion N-type MOSFET, the high resistance can be realized with a relatively small area by properly setting a gate length and a gate width.

Figure 7:
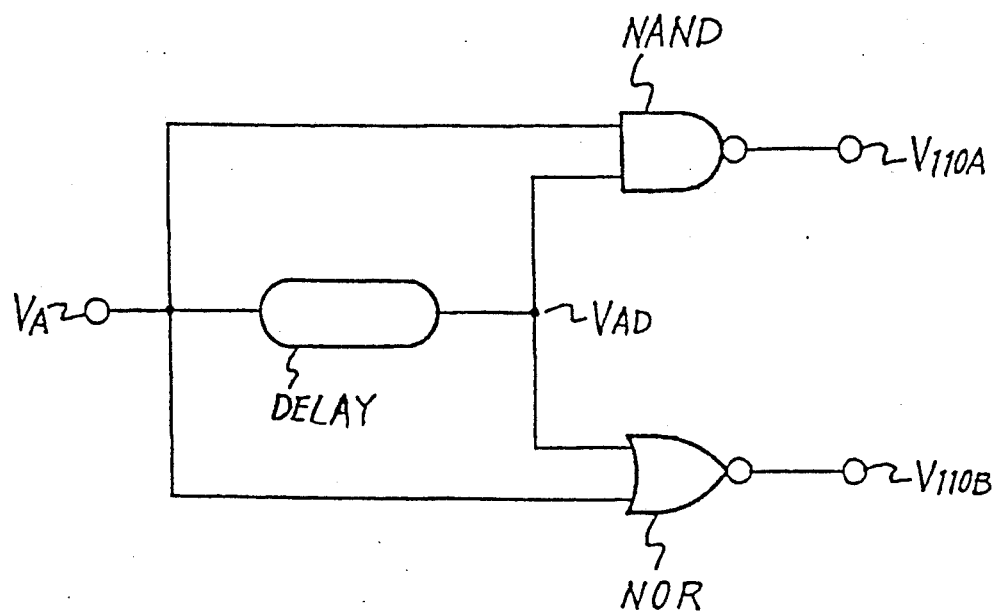
FIG. 7 is a circuit diagram showing the fourth embodiment of a well voltage control circuit according to the invention.

FIG. 7 is a circuit diagram showing the well voltage control circuit in the fourth embodiment of the invention. The shown embodiment of the well voltage control circuit includes the output terminal of a 2 input-type NAND circuit NAND as the first output terminal $V_{110A}$, which NAND circuit has one input terminal receiving the control signal $V_A$ and the other input terminal is connected to the output terminal $V_{AD}$ of a delay circuit DELAY to which the control signal $V_A$ is input, and the output terminal of a 2 input-type NOR circuit NOR as the second output terminal $V_{110B}$, which NOR circuit has one input for receiving the control signal $V_A$ and the other input connected to a delay circuit DELAY, to which the control signal $V_A$ is input. The first output terminal $V_{110A}$ is connected to the metal conductor 110A of FIG. 4A, and the second output terminal $V_{110B}$ is connected to the metal conductor 110B.

Figure 8:
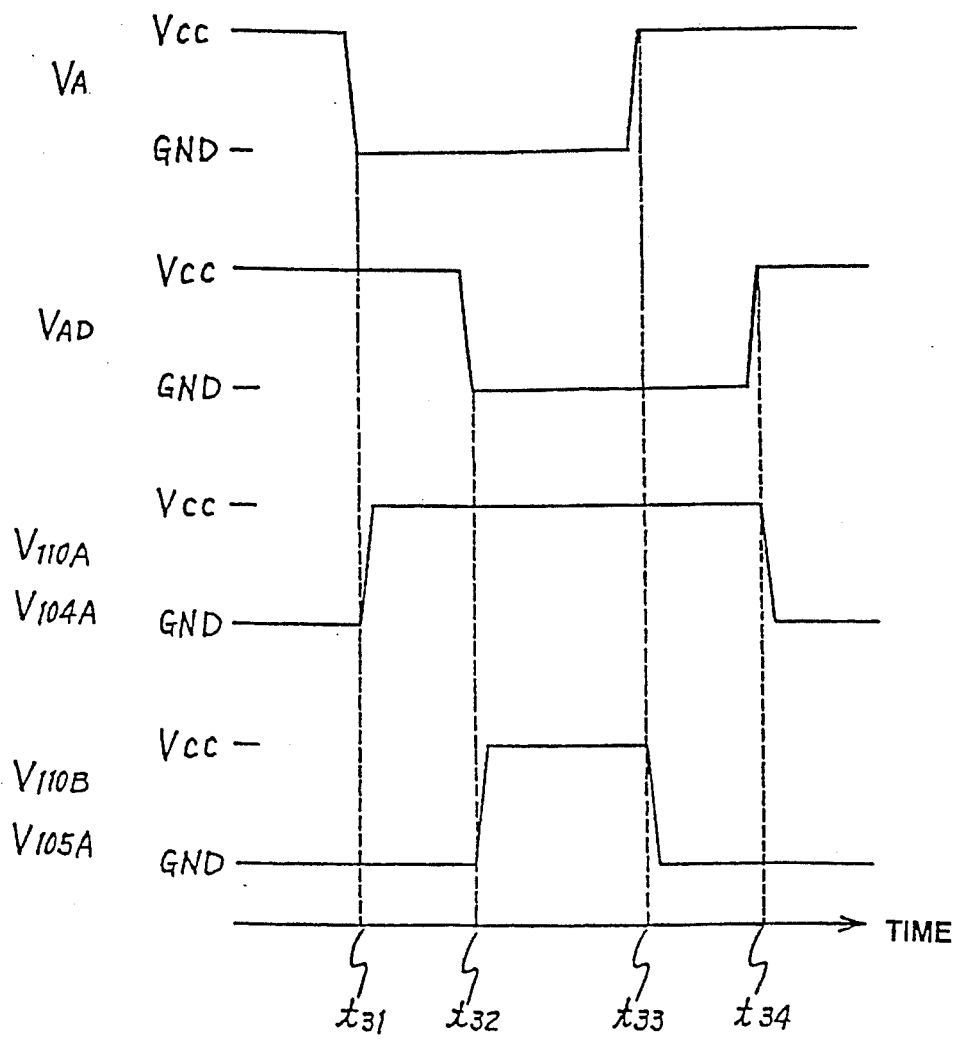
FIG. 8 is a chart of voltage waveforms at various portions showing operation of the fourth embodiment of the invention.

Next, operation of the shown embodiment will be discussed with reference to the chart of voltage waveform of FIG. 8. In the initial state, a control signal $V_A$ and the output $V_{AD}$ of the delay circuit DELAY are held at high level, the first output terminal $V_{110A}$ is held low level, the second output terminal $V_{110B}$ is also held low level, and the N-type well region 102 and the P-type well region 103 are both low levels, i.e. at the grounding voltage GND.

When the control signal $V_A$ is varied from high level to low level at a time $t_{31}$, the first output terminal $V_{110A}$ becomes high level due to low level at one input of the 2 input-type NAND circuit NAND. Then, the voltage $V_{104A}$ of the N-type impurity diffusion region 104A, to which the first output terminal $V_{110A}$ is connected via the metal conductor 110A becomes high level. Therefore, the voltage of the N-type well region 102 varies toward the high voltage via the N-type impurity diffusion region 104A. Subsequently, after a delay period $t_D$ set for the delay circuit DELAY, the output $V_{AD}$ becomes low level. Then, the second output terminal $V_{110B}$ becomes high level (at a time $t_{32}$) due to low levels of both of two inputs of the 2 input-type NOR circuit NOR. Therefore, the voltage $V_{105A}$ of the P-type impurity diffusion region 105A connected to the second output terminal $V_{110B}$ via the metal conductor 110B becomes high voltage. The voltage of the P-type well region 103 thus rises toward the high voltage by the voltage of the region 105A.

Next, when the control signal $V_A$ is switched from low level to high level at a time $t_{23}$, the second output terminal $V_{110B}$ becomes low level due to high level at one input of the 2 input-type NOR circuit NOR. Then, the voltage $V_{105A}$ of the P-type impurity diffusion region 105A connected to the second output terminal $V_{110B}$ via the metal conductor 110B becomes the low voltage. Accordingly, the voltage of the P-type well region 103 is varied toward the low voltage via the P-type impurity diffusion region 105A. Subsequently, after expiration of the set delay period $t_D$, the output $V_{AD}$ of the delay circuit DELAY becomes high level. In response thereto, the first output terminal $V_{110A}$ becomes low level due to high level at both inputs of the 2 input-type NAND circuit NAND (at a time $t_{34}$). Then, the voltage $V_{104A}$ of the N-type impurity diffusion region 104A connected to the first output terminal $V_{110A}$ via the metal conductor 110A becomes the low voltage so that the voltages of the N-type well region 102 and the N-type impurity diffusion region 104A varies toward the low level.

In the shown embodiment, by providing the delay circuit DELAY in the manner set forth above, a difference of timings of variation of the voltages of the N-type well region 102 and the P-type well region 103 can be provided. Therefore, it becomes possible to set the delay time $t_D$ so that the forward bias of the voltage relationship at the junction should not be established during transition in variation of the voltages of the N-type well region 102 and the P-type well region 103.

It should be noted that, although the embodiments discussed above employs the power source voltage Vcc for externally supplying the high voltage, it is possible to use the high voltage higher than the power source voltage Vcc as generated by a boosting circuit within the semiconductor device. Also, it is clearly possible to reverse the conductive type and the polarity to establish the equivalent circuits to those set forth above.

As set forth above, according to the present invention, since the voltage can be adjusted so as to avoid the forward bias in the voltage relationship at the junction between the P-type well region and the N-type well region, injection of holes to the semiconductor substrate in the transition in variation of the voltage can be successfully prevented so as to avoid unnecessary current. Also, it can prevent other circuits formed with the complementary type MOS transistors from causing latching up. Furthermore, even when the areas of the well regions are increased, it is unnecessary to provide a large number of impurity diffusion regions for well potential supply since the forward bias can be successfully avoided. Therefore, the semiconductor device can be maintained satisfactorily compact.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor device comprising:
   a one conductivity type semiconductor substrate;
   an opposite conductivity type well region formed on the surface of said semiconductor substrate;
   a one conductivity type well region formed on said opposite conductivity type well region;
   an insulated gate type field effect transistor formed in said one conductivity type well region; and
   well voltage control means for applying a first pulse, having a voltage level sufficient for establishing a reverse bias at the PN junction between said opposite conductivity type well region and said one conductivity type well region, to a first portion of said opposite conductivity type well region for a given period, and applying a second pulse, having said voltage level, to a second portion of said one conductivity type well region in a period between the initiation timing and termination timing of said first pulse, which second pulse has an initiation timing later than the initiation timing of said first pulse and a termination timing earlier than the termination timing of said first pulse.

2. A semiconductor device as set forth in claim 1, wherein said well voltage control means comprises:
first voltage supply means for generating said first pulse in response to a control signal;
second voltage supply means for generating said second pulse in response to said control signal;
connection means for connecting supply output terminals of said first and second voltage supply means, said connection means having a predetermined impedance; and
said first and second voltage supply means operating in complementary fashion.

3. A semiconductor device as set forth in claim 2, wherein said connection means comprises:
a first equivalent impedance between a third portion spaced from said first portion and positioned within said opposite conductivity well region and said first portion;
a second equivalent impedance between a fourth portion spaced from said second portion and positioned within said one conductivity well region; and
wiring means connecting said first and second equivalent impedances in series.

4. A semiconductor device as set forth in claim 2, wherein said connection means comprises a resistor element connected between the supply output terminals of said first and second voltage supply means.

5. A semiconductor device as set forth in claim 2, wherein said connection means comprises a depletion MOS type field effect transistor connected between the supply output terminals of said first and second voltage supply means.

6. A semiconductor device as set forth in claim 1, wherein said well voltage control means comprises:
delay means for delaying an external control signal;
first logic means for generating said first pulse during active state of at least one of the delayed output of said delay means and said external control signal; and
second logic means for generating said second pulse during active state of both of said delayed output and said external control signal.

7. A semiconductor device as set forth in any one of claims 1 to 6, wherein said insulation gate type field effect transistor is a storage element having a floating gate and a control gate and being electrically writable and erasable, and the voltage levels of said first and second pulses are sufficient for erasing information in said storage element.

8. A semiconductor device comprising a semiconductor substrate of one conductivity type, a first well region of an opposite conductivity type formed in said semiconductor substrate, a second well region of said one conductivity type formed in said first well region, at least one insulated gate field effect transistor formed in said second well region, a first contact region of said opposite conductivity type formed in a part of said first well region, a second contact region of said one conductivity type formed in a part of said second well region, and a well voltage control circuit supplying first and second well voltages respectively to said first and second contact regions and changing each of said first and second well voltages between a first voltage level and a second voltage level in response to a change in logic level of a control signal such that said first well voltage is changed from said first voltage level to said second voltage level at a first timing and said second well voltage is changed from said first voltage level to said second voltage level at a second timing after said first timing in response to a change of said control signal from a first logic level to a second logic level and that said first well voltage is changed from said second voltage level to said first voltage level at a third timing and said second well voltage is changed from said second voltage level to said first voltage level at a fourth timing before said third timing in response to a change of said control signal from said second logic level to said first logic level.

9. The semiconductor device as claimed in claim 8, wherein said well voltage control circuit includes a first transistor connected between a first voltage line supplied with said second voltage level and said first contact region and rendered conductive during said second logic level of said control signal, a second transistor connected between a second voltage line supplied with said first voltage level and said second contact region and rendered conductive during said first logic level of said control signal, a third contact region of said opposite conductivity type formed in said first well region apart from said first contact region, a fourth contact region of said one conductivity type formed in said second well region apart from said second contact region, and a conductive layer forming an electrical path between said third and fourth contact regions.

10. The semiconductor device as claimed in claim 8, wherein said well voltage control circuit includes a first transistor connected between a first voltage line supplied with said second voltage level and a first output node connected to said first contact region and rendered conductive during said second logic level of said control signal, a second transistor connected between a second voltage line supplied with said first voltage level and a second output node connected to said second contact region and rendered conductive during said first logic level of said control signal, and a resistive element connected between said first and second output nodes.

11. The semiconductor device as claimed in claim 10, wherein said resistive element comprises a resistor.

12. The semiconductor device as claimed in claim 10, wherein said resistive element comprises a field effect transistor.

13. The semiconductor device as claimed in claim 12, wherein said field effect transistor is of a depletion type.

14. The semiconductor device as claimed in claim 8, wherein said well voltage control circuit includes a delay circuit for delaying said control signal to produce a delayed control signal, a first gate circuit supplied with said control signal and said delayed control signal and producing said first well voltage in response thereto, and a second gate circuit supplied with said control signal and said delayed control signal and producing said second well voltage in response thereto.

15. The semiconductor device as claimed in claim 14, wherein said first gate circuit comprises a NAND gate and said second gate circuit comprises a NOR gate.

16. A semiconductor device comprising:
a one conductivity type semiconductor substrate;
an opposite conductivity type well region formed on the surface of said semiconductor substrate;

a one conductivity type well region formed on said opposite conductivity type well region;

an insulated gate type field effect transistor formed in said one conductivity type well region; and well voltage control means for applying a first pulse having a predetermined voltage level to a portion of said opposite conductivity type well region for a first period of time defined by a first initiation timing and a first termination timing and for applying a second pulse having a said predetermined voltage level to a portion of said one conductivity type well region for a second period of time defined by a second initiation timing and a second termination timing, said second initiation timing occurring later than said first initiation timing and said second termination timing occurring earlier than said first termination timing.

* * * * *

UNITED STATES PATENT AND TRADEMARK OFFICE
CERTIFICATE OF CORRECTION

PATENT NO. : 5,313,086
DATED : May 17, 1994
INVENTOR(S) : Jinbo

It is certified that error appears in the above-identified patent and that said Letters Patent is hereby corrected as shown below:

Column 4, line 22, change "110B" to --110C--.

Signed and Sealed this

Eleventh Day of October, 1994

Attest:

BRUCE LEHMAN

Attesting Officer

Commissioner of Patents and Trademarks